United States Patent
Langhammer

(10) Patent No.: US 9,118,349 B1
(45) Date of Patent: *Aug. 25, 2015

(54) CONTINUOUS PARALLEL CYCLIC BCH DECODING ARCHITECTURE

(71) Applicant: Altera Corporation, San Jose, CA (US)

(72) Inventor: Martin Langhammer, Salisbury (GB)

(73) Assignee: Altera Corporation, San Jose, CA (US)

( * ) Notice: Subject to any disclaimer, the term of this patent is extended or adjusted under 35 U.S.C. 154(b) by 151 days.

This patent is subject to a terminal disclaimer.

(21) Appl. No.: 14/087,192

(22) Filed: Nov. 22, 2013

Related U.S. Application Data

(63) Continuation of application No. 13/152,438, filed on Jun. 3, 2011, now Pat. No. 8,621,331.

(51) Int. Cl.
*H03M 13/15* (2006.01)
*H03M 13/00* (2006.01)

(52) U.S. Cl.
CPC ........ *H03M 13/152* (2013.01); *H03M 13/1545* (2013.01); *H03M 13/6561* (2013.01)

(58) Field of Classification Search
CPC .......... H03M 13/152; H03M 13/1545; H03M 13/6561
USPC .................................. 714/781, 782, 784, 785
See application file for complete search history.

(56) References Cited

U.S. PATENT DOCUMENTS

| | | | |
|---|---|---|---|
| 5,471,485 A | 11/1995 | Tong | |
| 5,490,154 A | 2/1996 | Mester | |
| 5,610,929 A | 3/1997 | Yamamoto | |
| 5,818,854 A | 10/1998 | Meyer | |
| 5,951,677 A | 9/1999 | Wolf et al. | |
| 6,154,869 A * | 11/2000 | Wolf | 714/784 |
| 6,637,002 B1 | 10/2003 | Weng et al. | |
| 6,691,277 B1 | 2/2004 | Golnabi et al. | |
| 6,983,414 B1 | 1/2006 | Duschatko et al. | |
| 7,516,394 B2 | 4/2009 | Ashley et al. | |
| 7,941,734 B2 | 5/2011 | Chang et al. | |
| 8,086,941 B2 | 12/2011 | Williamson et al. | |
| 8,312,345 B1 | 11/2012 | Feng | |
| 8,621,331 B1 * | 12/2013 | Langhammer | 714/781 |
| 2006/0059409 A1 | 3/2006 | Lee | |
| 2008/0320370 A1 * | 12/2008 | Shinagawa et al. | 714/777 |
| 2009/0077145 A1 | 3/2009 | Dobbelaere | |
| 2009/0150754 A1 | 6/2009 | Dohmen et al. | |
| 2010/0031124 A1 * | 2/2010 | Shinagawa et al. | 714/777 |

FOREIGN PATENT DOCUMENTS

EP    1 102 406 A2    5/2011

* cited by examiner

*Primary Examiner* — John J Tabone, Jr
(74) *Attorney, Agent, or Firm* — Ropes & Gray LLP; Jeffrey H. Ingerman

(57) ABSTRACT

Circuitry for, in p parallel streams, searching a codeword having n symbols for roots of a cyclic code polynomial having a number of terms includes a plurality of multipliers, a source of constants derived from roots of the polynomial, and at least one counter that supplies an index. For each received symbol of the codeword, the multipliers multiply respective terms of the polynomial for a previous received symbol by constants from the source of constants, the counter advances to select respective products of the constants and the respective terms for the previous received symbol.

33 Claims, 9 Drawing Sheets

FIG. 1

| 247 | 7   | 254 | 246 | 6   | 253 |     | 5   | 252 | 4   |     |
|-----|-----|-----|-----|-----|-----|-----|-----|-----|-----|-----|
| 248 | 8   | 0   | 247 | 7   | 254 |     | 6   | 253 | 5   |     |
| 249 | 9   | 1   | 248 | 8   | 0   |     | 7   | 254 | 6   |     |
| 250 | ... | 2   | 249 | ... | 1   |     | 8   | 0   | 7   |     |
| 251 |     | 3   | 250 |     | 2   |     | ... | 1   | ... | 0   |
| 252 | ... | 4   | 251 |     | 3   | ... | 2   | 2   |     | 1   |
| 253 | 245 | 5   | 252 | 244 | 4   | 251 | 3   | 3   |     | 2   |
| 254 | 246 | 6   | 253 | 245 | 5   | 252 | 4   | 4   |     | 3   |

FIG. 2

| 15 | 11 | 7  | 3  | 18 | 14 | 10 | 6  | 2  | 17 | 13 | 9  | 5  | 1  | 16 | 12 | 8  | 4  | 0  | 15 |
|----|----|----|----|----|----|----|----|----|----|----|----|----|----|----|----|----|----|----|----|
| 16 | 12 | 8  | 4  | 0  | 15 | 11 | 7  | 3  | 18 | 14 | 10 | 6  | 2  | 17 | 13 | 9  | 5  | 1  | 16 |
| 17 | 13 | 9  | 5  | 1  | 16 | 12 | 8  | 4  | 0  | 15 | 11 | 7  | 3  | 18 | 14 | 10 | 6  | 2  | 17 |
| 18 | 14 | 10 | 6  | 2  | 17 | 13 | 9  | 5  | 1  | 16 | 12 | 8  | 4  | 0  | 15 | 11 | 7  | 3  | 18 |

CONTINUOUS PARALLEL CYCLIC BCH DECODING ARCHITECTURE

CROSS REFERENCE TO RELATED APPLICATION

This is a continuation of copending, commonly-assigned U.S. patent application Ser. No. 13/152,438, filed Jun. 3, 2011, now U.S. Pat. No. 8,621,331, which is hereby incorporated by reference herein in its entirety.

FIELD OF THE INVENTION

This invention relates to parallel decoding of cyclic BCH codes, and particularly Reed-Solomon codes, and to circuitry for performing such decoding, particularly in a programmable logic device (PLD).

BACKGROUND OF THE INVENTION

The speed requirements for decoders for Reed-Solomon codes and other cyclic BCH codes, which involve finding the roots of a polynomial over a finite field, continue to increase. One approach to increasing decoder speed may be to parallelize the polynomial search. However, it would be rare for the length of the codeword to be an integer multiple of the number of parallel processing streams; indeed, in most cases that would be expected not to be true. Therefore, the polynomial search normally would not be aligned with the data, requiring substantial additional logic to keep track of the data alignment.

SUMMARY OF THE INVENTION

The present invention relates to circuitry and methods for effectively maintaining data alignment during parallelized searching for the roots of a cyclic BCH code polynomial such as a Reed-Solomon code polynomial.

The polynomial search of a codeword including n symbols, with indices 0 through n-1, may be broken into as many segments as the number of parallel streams p in the decoder.

In one arrangement, the first search may start at the last-received symbol at index n-1 and also searches symbols at indices n-2, n-3, ..., n-(p-1). The second search then starts at index n-p and also searches symbols at indices n-p-1, n-p-2, ..., n-(2p-1). The third search starts at index n-2p and so on. In this arrangement, the start position for each segment can be determined with a counter that either is modulo-p and increments by 1, or is modulo-n and increments by p. Each polynomial term requires a variable frequency shift, equivalent to a shift of position in the codeword by multiplying each polynomial term by a power of the primitive root of the field, as described below.

In other arrangements, the first search starts at the last-received symbol at index n-1 and also searches symbols at indices n-1-p, n-1-2p, n-1-3p, ..., n-1-(FLOOR(n/p))p. The second search starts at the symbol at index n-2 and also searches symbols at indices n-2-p, n-2-2p, n-2-3p, ..., n-2-(FLOOR(n/p))p. The third search starts at the symbol at index n-3 and so on. These indices are modulo n—i.e., if any of these indices are negative (which can occur), then n will be added to the index value.

In such cases, every frequency shift that may be applied to a polynomial term—i.e., p shifts—is applied to that term, requiring p constant coefficient finite field multipliers (i.e., finite field multipliers one of whose inputs is held constant). Although there are more multipliers than in the previous embodiment, each constant coefficient finite field multiplier is about 20% of the size of a variable coefficient finite field multiplier. Several different architectures are provided in accordance with the invention to implement such arrangements.

Therefore, in accordance with the present invention, there is provided circuitry for, in p parallel streams, searching a codeword having n symbols for roots of a cyclic code polynomial having a number of terms. The circuitry includes a plurality of multipliers, a source of constants derived from roots of the polynomial, and at least one counter that supplies an index. For each received symbol of the codeword, the multipliers multiply respective terms of the polynomial for a previous received symbol by constants from the source of constants, the counter advances to select respective products of the constants and the respective terms for the previous received symbol.

A method of configuring such circuitry on a programmable device, and a machine-readable data storage medium encoded with software for performing the method, are also provided.

BRIEF DESCRIPTION OF THE DRAWINGS

Further features of the invention, its nature and various advantages will be apparent upon consideration of the following detailed description, taken in conjunction with the accompanying drawings, in which like reference characters refer to like parts throughout, and in which:

FIG. 1 shows an example of parallelizing the polynomial root search for a codeword example of n symbols where n=255 and the number of parallel streams p is 8;

FIG. 2 shows an example of parallelizing the polynomial root search for a codeword example of n symbols where n=19 and the number of parallel streams p is 4;

DETAILED DESCRIPTION OF THE INVENTION

Figure 3:
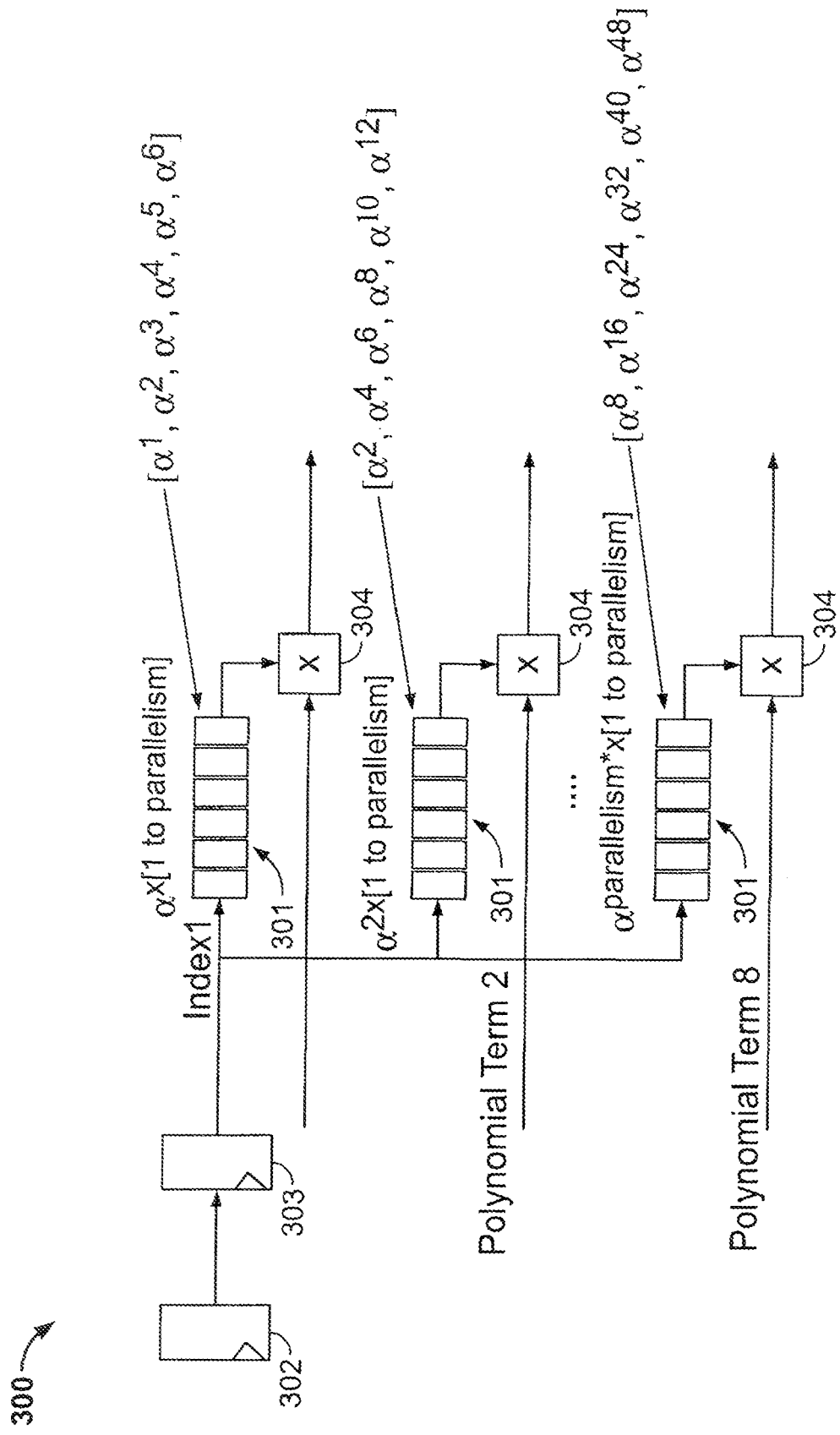
FIG. 3 shows exemplary circuitry in accordance with an embodiment of the present invention for applying respective coefficient to a respective polynomial term.

The present invention may be used to perform parallel polynomial searches in cyclic BCH decoding, even where the number of symbols in a codeword is not an integer multiple of the number of parallel streams, without complicated logic for keeping track of the starting indices for the searches.

Specifically, the invention allows a continuous search for the roots of a polynomial defined over a finite field. Multiple copies of the polynomial are made, and each is searched for a subset of the possible roots that can exist for the codeword. This technique can be used for Reed-Solomon coding or other BCH codes, or any other code where an error locator polynomial can be generated.

The well-known Chien search algorithm is an example of a method for searching the roots of a polynomial, as follows.

An error locator polynomial can be defined as:

$$\Lambda(x) = \sum_{j=0}^{k} \Lambda_j x^j$$

Searching at any possible root $\alpha^i$, where i is the index of the location in the codeword:

$$\Lambda(\alpha^i) = \sum_{j=0}^{k} \Lambda_j \alpha^{ij}$$

As the index is increased the value of any term can be calculated by multiplying that term by its first root.

For example, a three-term polynomial may have a value of:

$$\Lambda(\alpha^i) = \Lambda_0 \alpha^i + \Lambda_1 \alpha^{2i} + \Lambda_2 \alpha^{3i}$$

and the next search will have a value of:

$$\Lambda(\alpha^{(i+1)}) = \Lambda_0 \alpha^{(i+1)} + \Lambda_1 \alpha^{(2i+2)} + \Lambda_2 \alpha^{(3i+3)}$$

Each term, therefore can be generated by multiplying the current term by a constant—in this case $\alpha^1$, $\alpha^2$ and $\alpha^3$.

The first received symbol in a codeword (for a maximal-length Reed-Solomon code) has the (n-1)th index, corresponding to a term of $\alpha^{(n-1)}$. Because the field indices are modulo (n-1), $\alpha^{(n-1)} = \alpha^1$. The set of terms applicable to the (n-1)th index are $\alpha^1$, $\alpha^2$, $\alpha^3$, and so on. The terms for the (n-2)th index are $\alpha^2$, $\alpha^4$, $\alpha^6$, and so on.

FIG. 1 shows the problem in parallelizing the polynomial root search for a codeword example of n symbols where n=255 (i.e., the indices run from 0 to 254) and the number of parallel streams p is 8. The start (i.e., index 254) of each subsequent codeword changes position, returning to the same position after a period of up to p codewords. The number of clock cycles between codewords can be as few as floor(n/p) and as many as ceil(n/p). Therefore, the polynomial must be evaluated for n roots in as few as floor(n/p) clock cycles.

As noted above, according to embodiments of the invention, the first search starts at the last-received symbol at index n-1 and also searches symbols at indices n-1-p, n-1-2p, n-1-3p, . . . , n-1-(FLOOR(n-1/p))p. The second search starts at the symbol at index n-2 and also searches symbols at indices n-2-p, n-2-2p, n-2-3p, . . . , n-2-(FLOOR(n-1/p))p. The third search starts at the symbol at index n-3 and so on. In a first arrangement, each polynomial term requires a variable frequency shift, which in turn requires a variable coefficient finite field multiplier as described above.

The second and subsequent searches require an additional step to implement. Although the index increment is the same for all the parallel searches in this method, the second and subsequent searches need to be shifted to their search start locations before searching can start.

For this method, the second search must be shifted by p positions (performed by multiplying the error locator polynomial terms by $\alpha^p$, $\alpha^{2p}$, $\alpha^{3p}$, etc for the second search, $\alpha^{2p}$, $\alpha^{4p}$, $\alpha^{6p}$, etc for the third search and so on). For a large number of check symbols, and a large amount of parallelism, it is possible that the $\alpha^{yp}$ term may have an exponent larger than the field, in which case the new exponent will be modulo the largest field size.

It is also possible to search from the last received symbol in the codeword in the direction of the first received symbol. If so, the field index would be $\alpha^0$, or 1. For a decoder that processes only one symbol at a time this has the advantage of supporting shortened codewords without any initial shifts.

The next issue is mapping the calculated error locations to the correct index in the decoder. This problem is not straightforward, as noted above, because the length of the codeword modulo-p will usually be non-zero. For example, FIG. 2 shows a 19-symbol codeword processed with a parallelism p=4. The indices are numbered 0 through 18. Because mod (19/4)=3, there are 3 symbols of the first codeword in the fifth input cycle, plus the first symbol of the next codeword. p codewords have to be processed before the first input cycle of a codeword contains only data from that codeword (i.e., input indices from 18 through 15).

For purposes of discussion, one can consider a case where p=6, meaning there are six streams, and each polynomial has eight terms. The start position of each stream s will be (s-1)—i.e., the first stream starts at index 0, the second stream starts at index 1, etc., with the sixth stream starting at index 5. The start number of each stream will increment by (n mod p) for each new codeword. If n=245, then stream 1 will have an index of 0 for the first codeword, an index of 1 for the second codeword, an index of 2 for the third codeword, etc., until the index reverts to 0.

For stream 1, the index 0 writes out eight field elements. Each field element is used to multiply (frequency shift) one term of the polynomial to its start position. As discussed above, a variable coefficient finite field multiplier is used because both inputs (polynomial terms and frequency shift elements) change from codeword to codeword.

In this example, the coefficients for the first two streams are as follows:

Stream1:
$[\alpha^1, \alpha^2, \alpha^3, \alpha^4, \alpha^5, \alpha^6, \alpha^7, \alpha^8]$
$[\alpha^2, \alpha^4, \alpha^6, \alpha^8, \alpha^{10}, \alpha^{12}, \alpha^{14}, \alpha^{16}]$
$[\alpha^3, \alpha^6, \alpha^9, \alpha^{12}, \alpha^{15}, \alpha^{18}, \alpha^{21}, \alpha^{24}]$
. . .
$[\alpha^6, \alpha^{12}, \alpha^{18}, \alpha^{24}, \alpha^{30}, \alpha^{36}, \alpha^{42}, \alpha^{48}]$ Stream2:
$[\alpha^2, \alpha^4, \alpha^6, \alpha^8, \alpha^{10}, \alpha^{12}, \alpha^{14}, \alpha^{16}]$
$[\alpha^3, \alpha^6, \alpha^9, \alpha^{12}, \alpha^{15}, \alpha^{18}, \alpha^{21}, \alpha^{24}]$
. . .
$[\alpha^6, \alpha^{12}, \alpha^{18}, \alpha^{24}, \alpha^{30}, \alpha^{36}, \alpha^{42}, \alpha^{48}]$
$[\alpha^1, \alpha^2, \alpha^3, \alpha^4, \alpha^5, \alpha^6, \alpha^7, \alpha^8]$ The rows of coefficients wrap around from one stream to the next. For Stream3, the second row of coefficients from Stream2 would be the first row of coefficients, while the first row of coefficients from Stream2 would be the last row of coefficients, and this pattern would continue for all streams (up to Stream6 in this example).

Figure 4:
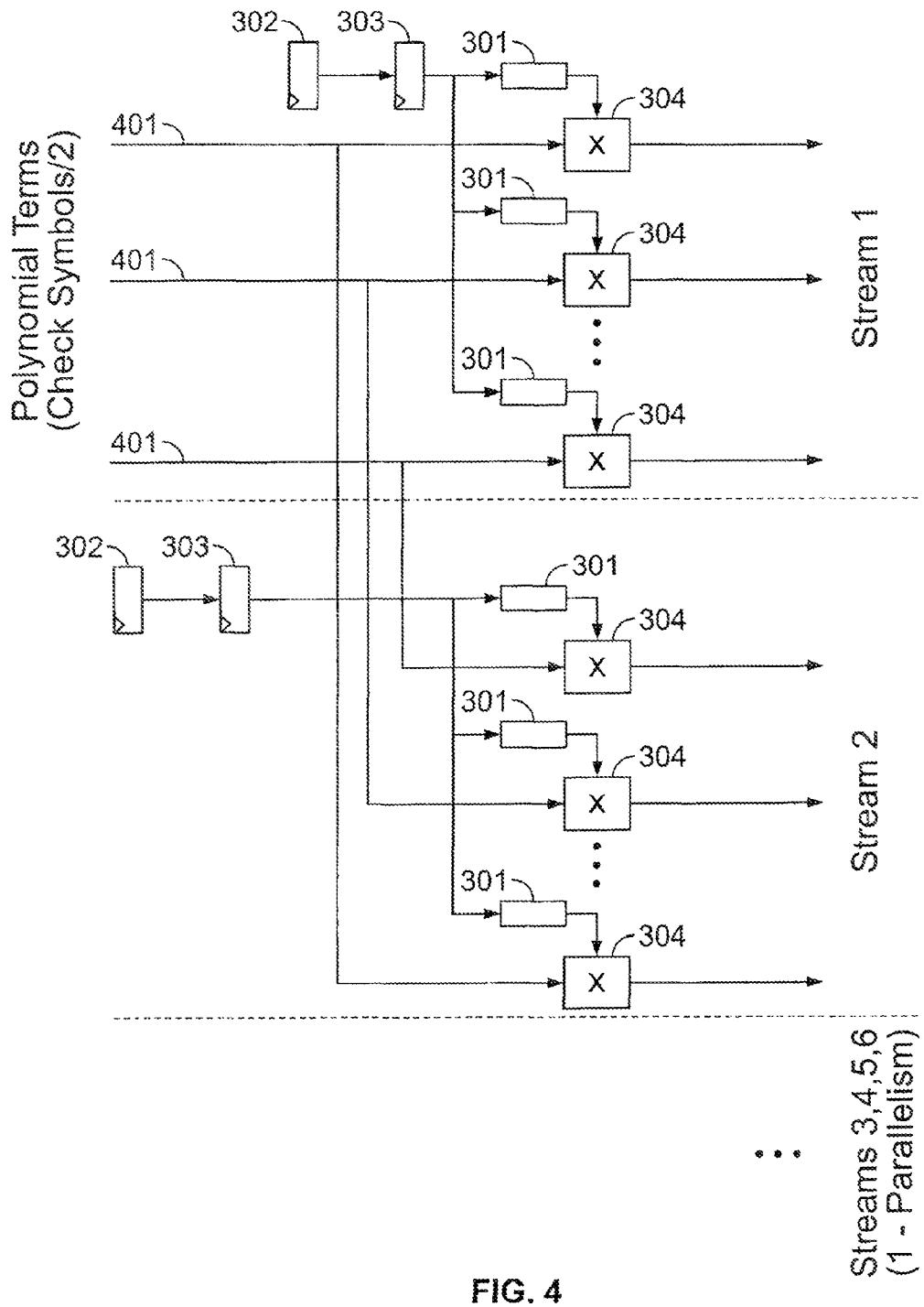
FIG. 4 shows p parallel exemplary circuits similar to that of FIG. 3, in accordance with an embodiment of the present invention.

In accordance with the index pattern described above, on each index x, the xth column—i.e., the xth coefficient in each respective row of coefficients—would be applied to each respective polynomial term. One embodiment of circuitry 300 for doing so is shown, for one stream, in FIG. 3. The coefficients are stored in memories 301, equal in number to the number of terms in the polynomial. Each memory 301 holds p coefficients. Thus, in FIG. 3, memory 301 for the first term holds coefficients $\alpha^x$ (x=1, ..., p), memory 301 for the second term holds coefficients $\alpha^{2x}$ (x=1, ..., p), and so on through memory 301 for the last term (the eighth term in this example) which holds coefficients $\alpha^{8x}$ (x=1, ..., p)—the intermediate terms take the form $\alpha^{nx}$ (n=3, ..., 7; x=1, ..., p). A counter 302 is initialized to the stream number start position (0, ..., p-1) for the particular stream. The counter value is latched into register 303 and used as the index for each memory 301. As seen in FIG. 4, there are p parallel circuits 300, one for each stream, sharing polynomial terms 401. While each iteration of circuit 300 has its own counter 302, in an alternative arrangement (not shown), there could be only one counter 302, whose value is incremented for each successive stream. For example, they could be loaded from a table based on the start index in counter 302. These embodiments would require as many variable coefficient finite field multipliers 304 as there are terms in the polynomials.

In alternate embodiments, the error evaluator polynomial ($\Omega$) could be shifted by the multipliers at different clock cycles than the error locator ($\Lambda$) polynomial. Although both polynomials would be searched in the same sequence, the difference in the shift times would mean that one polynomial sum would have to be delayed by 1 or more clock cycles before combining with the other sum. If the maximum number of error instances is 8, and p=8, then solving for the roots of these two polynomials would take 8×8×2=128 variable coefficient finite field multipliers or about 6400 adaptive look-up tables.

As noted above, according to a another embodiment of the invention, the first search starts at the last-received symbol at index n-1 and also searches symbols at indices n-1-x, n-1-2x, n-1-3x, ..., n-1-(FLOOR(n/x))x. The second search starts at the symbol at index n-2 and also searches symbols at indices n-2-x, n-2-2x, n-2-3x, ..., n-2-(FLOOR(n/x))x. The third search starts at the symbol at index n-3 and so on. In this case, every frequency shift that may be applied to a polynomial term—i.e., p shifts—is applied to that term, requiring p constant coefficient finite field multipliers. Although there are more multipliers than in the previous embodiment, each constant coefficient finite field multiplier is about 20% of the size of a variable coefficient finite field multiplier.

According to this embodiment, for the second and subsequent searches, each search is shifted by one position from the previous search—i.e. $\alpha^1$, $\alpha^2$, $\alpha^3$, etc. for the second search, $\alpha^2$, $\alpha^4$, $\alpha^6$, etc. for the third search, and so on, although the constant multiplied by each term during the search is now larger—e.g. $\alpha^p$, $\alpha^{2p}$, $\alpha^{3p}$, etc. All searches may use the same constant coefficient multipliers.

Figure 5:
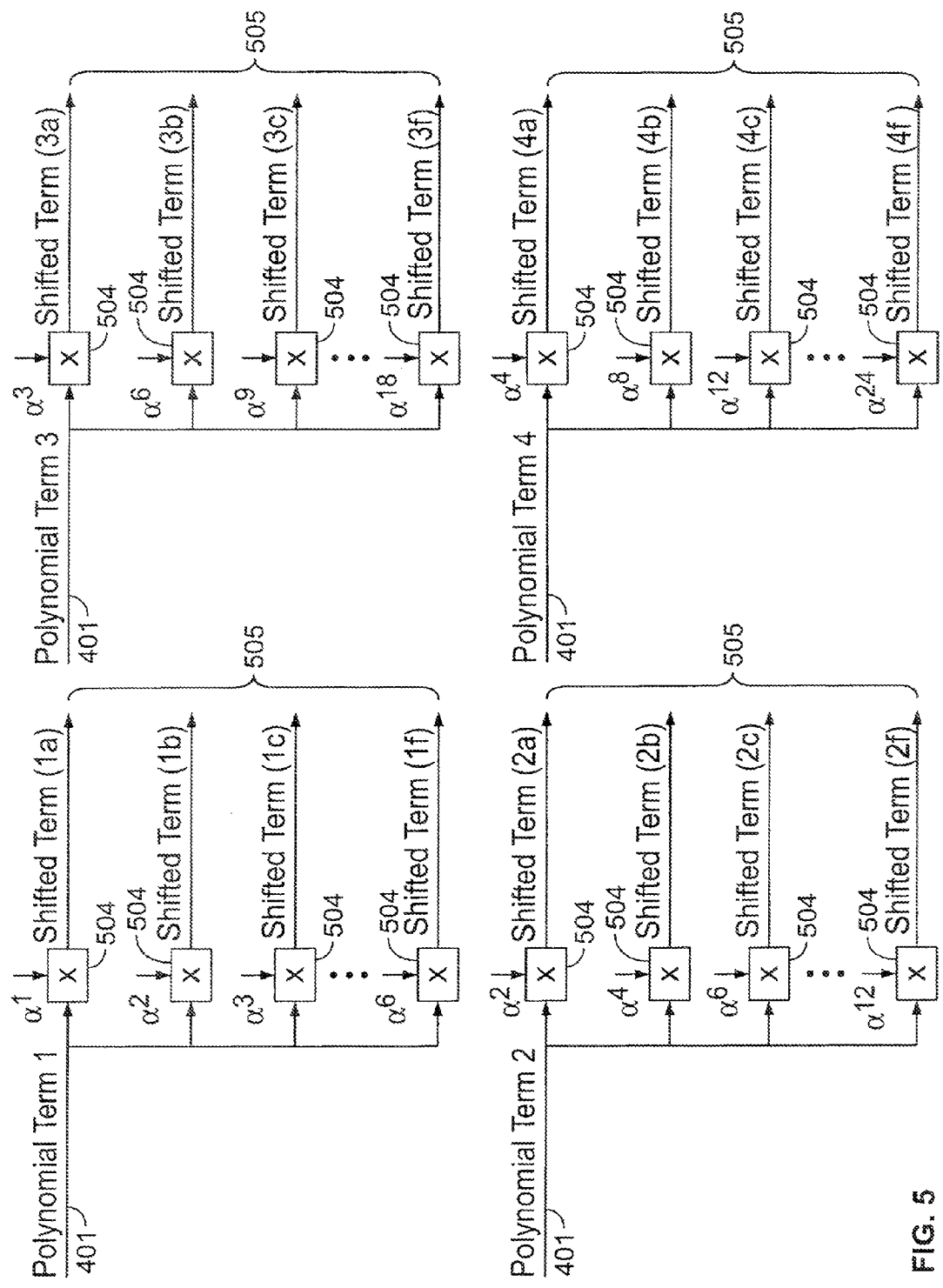
FIG. 5 shows an exemplary arrangement of multipliers for multiplying each polynomial term by all possible shifts in accordance with another embodiment of the invention.
Figure 6:
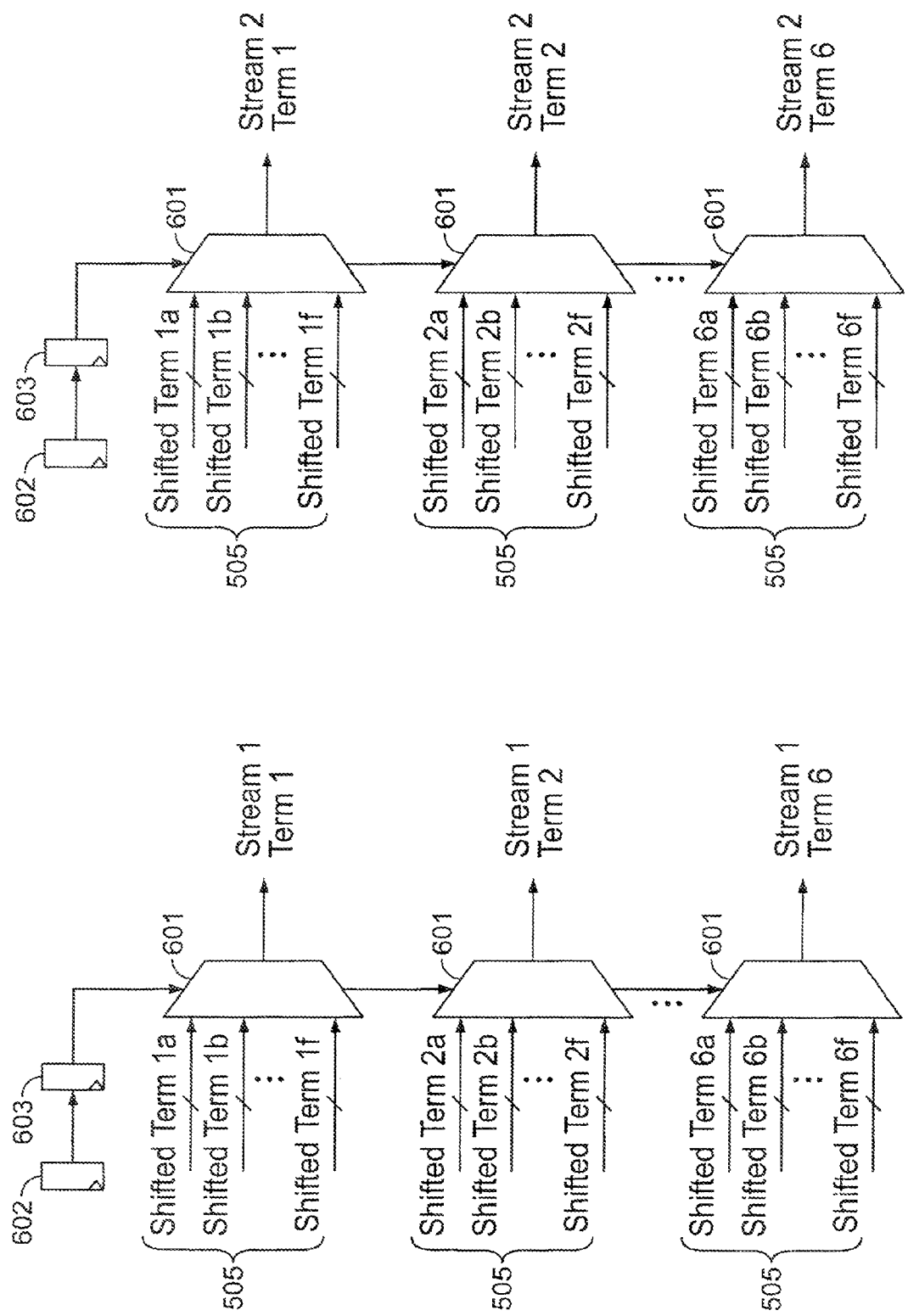
FIG. 6 shows exemplary circuitry, in accordance with an embodiment of the present invention, for use with the arrangement of FIG. 5 where the number of possible shifts is equal to the parallelism p.
Figure 7:
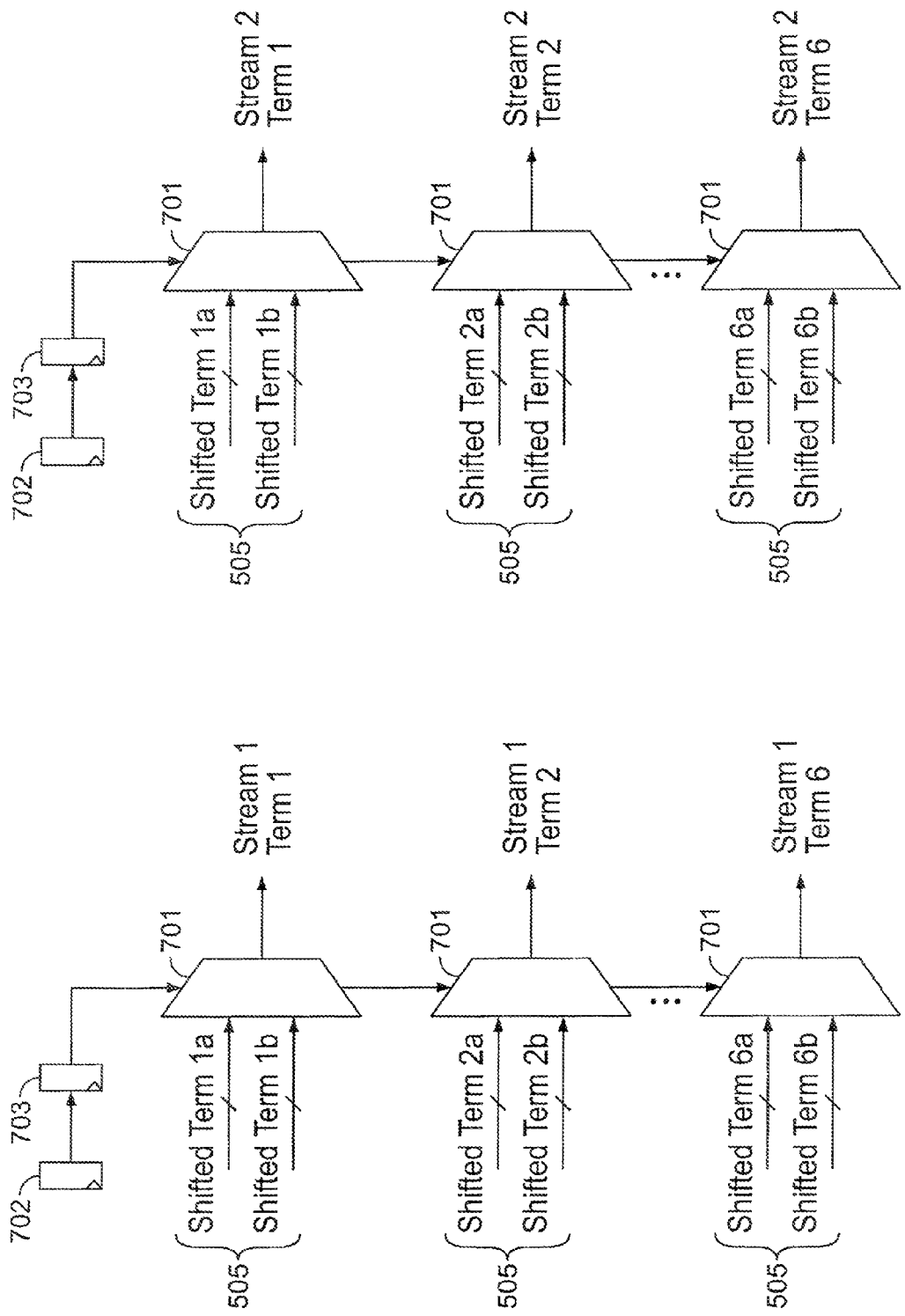
FIG. 7 shows exemplary circuitry, in accordance with an embodiment of the present invention, for use with the arrangement of FIG. 5 where the number of possible shifts is less than the parallelism p.

Circuitry for implementing such an embodiment is shown in FIGS. 5-7. FIG. 5 shows an arrangement of constant coefficient fixed field multipliers 504 for multiplying each polynomial term 401 by all possible shifts to derive shifted terms 505. The number of multipliers needed is thus the product of the number of polynomial terms and the number of parallel streams. The number of polynomial terms is dependent on the number of check symbols in the codeword and typically is one-half of the number of check symbols. The number of possible shift values will likely be the same as the parallelism p, but may be less, depending on the relationship between the codeword length n and the parallelism p. For example with n=255 and p=8, the number of possible shifts is 8, because 255 mod 8=7, meaning 1 symbol out of 8 inputs is missing, so it will take 8 codewords to make up the missing symbols for the cycle to repeat. Similarly, in the case of n=242 and p=4, the number of possible shifts is 2, because 242 mod 4=2, meaning 2 symbols out of 4 inputs are missing, so it will take 2 codewords to make up the missing symbols for the cycle to repeat. More generally, the number of repetitions r can be determined from MOD(nr, FLOOR((n/p)r))=0.

FIG. 6 shows the case where the number of possible shifts is equal to the parallelism p. Each term of each stream is derived by respective multiplexer 601, which has as inputs all possible shifted terms 505 for that term. The modulo count value from respective counter 602 latched into respective register 603 (similar to that described in connection with FIG. 3, above) selects the current shift value. The multiplexer inputs are all the same for all streams, but the counter value latched into respective register 603 will be different, because the respective counters 602 for the different streams are initialized to different values.

FIG. 7 shows the case where the number of possible shifts is less than the parallelism p. As in FIG. 6, each term of each stream is derived by respective multiplexer 701, which has as inputs all possible shifted terms 505 for that term. However, the number of shifts—and therefore the number of inputs per multiplexer—is smaller than in FIG. 6. Again, the modulo count value from respective counter 702 latched into respective register 703 selects the current shift value.

Figure 8:
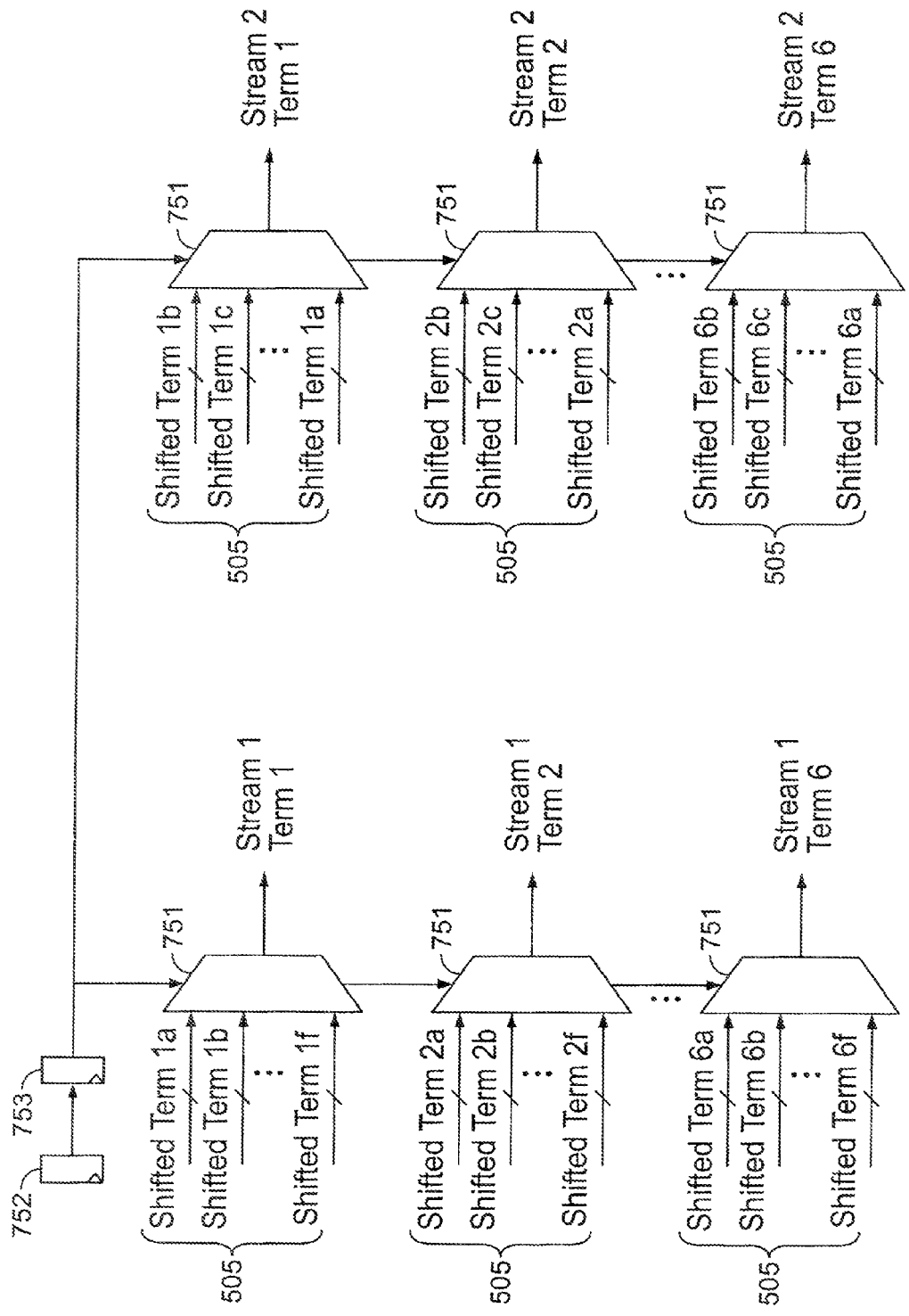
FIG. 8 shows exemplary circuitry, in accordance with an embodiment of the present invention, similar to FIG. 6, but where a single counter can be used to control multiplexers in all p streams.

As noted above, the rows of coefficients wrap around from one stream to the next, so that the indices behave accordingly. Therefore, as shown in FIG. 8, a single counter 752, with latch 753, can be used to control multiplexers 751 in all p streams. Here, instead of having respective different values latched from respective counters, the order of the inputs to the respective multiplexers for the respective streams is permuted according to the order in which the inputs are used for that stream. Although the circuitry in FIG. 8 resembles that of FIG. 6, a single counter, also can be used to control multiplexers in all p streams in circuitry such as that of FIG. 7 where the number of possible shifts is less than the parallelism p.

In these embodiments, if the maximum number of error instances is 8, and p=8, then solving for the roots of the two polynomials would take 8×8×2=128 constant coefficient finite field multipliers for a maximum of about 10 adaptive look-up tables, plus multiplexers.

The embodiments described above show searching from the first received symbol in the codeword in the direction of the last received symbol—i.e., from n-1 down to 0. The root search of the polynomials also may be performed in this sequence, so that as error locations are found, corrections can be applied to a simply-delayed version of the received symbols. With p parallel streams, any stream search start location may have to be shifted (performed by multiplying each polynomial term with a power of the primitive root) by up to p different positions, with shift indices from 0 to p-1.

It also is possible to search from the last received symbol in the codeword in the direction of the first received symbol—i.e., from 0 up to n-1 rather than from n-1 down to 0. Specifically, if the codeword length can be changed dynamically, then the total number of shift positions increases to n. In the case of variable coefficient multipliers this would require large coefficient memories, and the may reduce the feasibility of the constant coefficient multiplier case.

However, if the search locations are counted up from 0 to n-1, rather than down from n-1 to 0, then even if the codeword length can change, the number of possible shift locations is again p, with shift indices from 0 to p-1, because the uncertain value of n no longer causes an uncertainty in where to start. As the modulo counters overflow, they initialize the search multipliers again. Some of the counters may be set to a negative value at the first initialization, which will wrap around to a start value of the next codeword. For example if the maximum codeword length is 255 with p=8, then index 0=0 (current codeword) and index −1=254 (first received symbol of next codeword). In that case the counter for the top stream will be initialized to −1 (254), and the counters for the other streams will be initialized to 0, 1, 2, 3, 4, 5 and 6. The next codeword will have stream indexes set to −2, −1, 0, 1, 2, 3, 4, 5, corresponding to 253, 254, 0, 1, 2, 3, 4, 5.

Because counting up requires accessing the symbols in the opposite order from which the symbols are received, all of the symbols in the codeword will need to be stored in a buffer memory and read out in reverse order. As noted above, a negative counter index will refer to the next codeword, which will be available, because entire codewords will be buffered.

The embodiments shown above are merely exemplary. These and other configurations in accordance with the invention can be implemented in programmable integrated circuit devices such as programmable logic devices, where programming software can be provided to allow users to configure a programmable device to perform the various multiplications and other operations.

The structures described above also may be provided in fixed logic, in which case the sizes of the various computational components may be fixed to a particular application. Alternatively, the fixed logic circuitry could allow for limited parameterization.

Instructions for carrying out a method according to this invention for programming a programmable device to perform matrix decomposition may be encoded on a machine-readable medium, to be executed by a suitable computer or similar device to implement the method of the invention for programming or configuring PLDs or other programmable devices to perform addition and subtraction operations as described above. For example, a personal computer may be equipped with an interface to which a PLD can be connected, and the personal computer can be used by a user to program the PLD using a suitable software tool, such as the QUARTUS® II software available from Altera Corporation, of San Jose, Calif.

Figure 9:
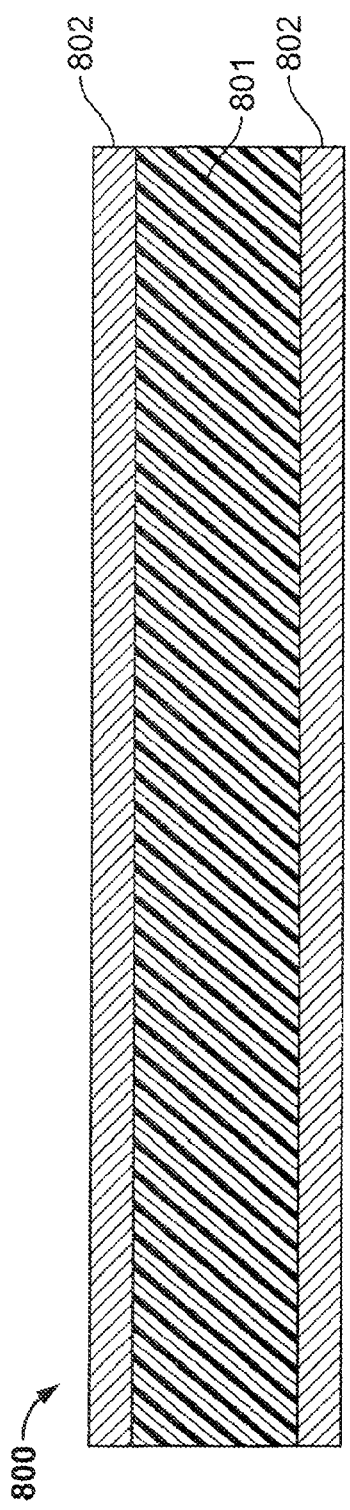
FIG. 9 is a cross-sectional view of a magnetic data storage medium encoded with a set of machine-executable instructions for performing the method according to the present invention.

FIG. 9 presents a cross section of a magnetic data storage medium 800 which can be encoded with a machine executable program that can be carried out by systems such as the aforementioned personal computer, or other computer or similar device. Medium 800 can be a floppy diskette or hard disk, or magnetic tape, having a suitable substrate 801, which may be conventional, and a suitable coating 802, which may be conventional, on one or both sides, containing magnetic domains (not visible) whose polarity or orientation can be altered magnetically. Except in the case where it is magnetic tape, medium 800 may also have an opening (not shown) for receiving the spindle of a disk drive or other data storage device.

The magnetic domains of coating 802 of medium 800 are polarized or oriented so as to encode, in manner which may be conventional, a machine-executable program, for execution by a programming system such as a personal computer or other computer or similar system, having a socket or peripheral attachment into which the PLD to be programmed may be inserted, to configure appropriate portions of the PLD, including its specialized processing blocks, if any, in accordance with the invention.

Figure 10:
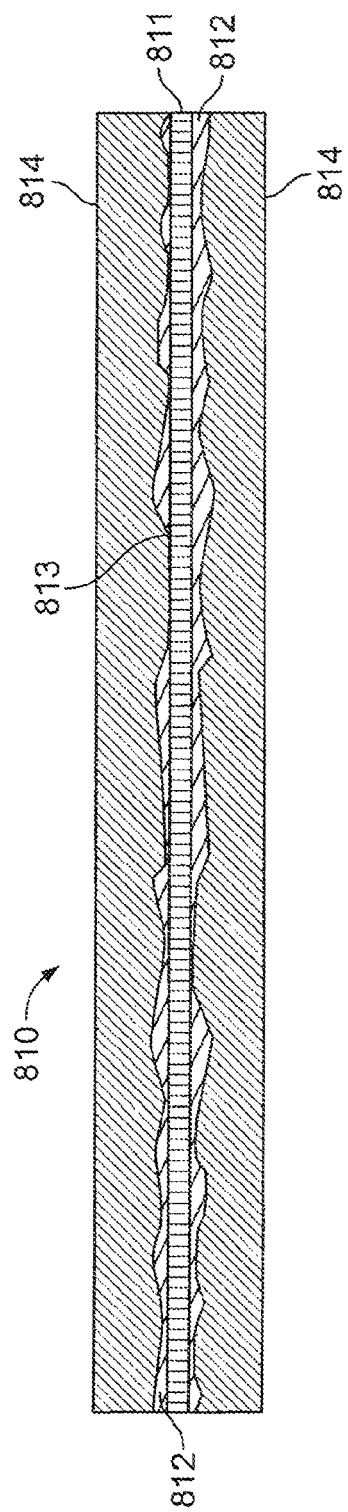
FIG. 10 is a cross-sectional view of an optically readable data storage medium encoded with a set of machine executable instructions for performing the method according to the present invention.

FIG. 10 shows a cross section of an optically-readable data storage medium 810 which also can be encoded with such a machine-executable program, which can be carried out by systems such as the aforementioned personal computer, or other computer or similar device. Medium 810 can be a conventional compact disk read-only memory (CD-ROM) or digital video disk read-only memory (DVD-ROM) or a rewriteable medium such as a CD-R, CD-RW, DVD-R, DVD-RW, DVD+R, DVD+RW, or DVD-RAM or a magneto-optical disk which is optically readable and magneto-optically rewriteable. Medium 810 preferably has a suitable substrate 811, which may be conventional, and a suitable coating 812, which may be conventional, usually on one or both sides of substrate 811.

In the case of a CD-based or DVD-based medium, as is well known, coating 812 is reflective and is impressed with a plurality of pits 813, arranged on one or more layers, to encode the machine-executable program. The arrangement of pits is read by reflecting laser light off the surface of coating 812. A protective coating 814, which preferably is substantially transparent, is provided on top of coating 812.

In the case of magneto-optical disk, as is well known, coating 812 has no pits 813, but has a plurality of magnetic domains whose polarity or orientation can be changed magnetically when heated above a certain temperature, as by a laser (not shown). The orientation of the domains can be read by measuring the polarization of laser light reflected from coating 812. The arrangement of the domains encodes the program as described above.

Figure 11:
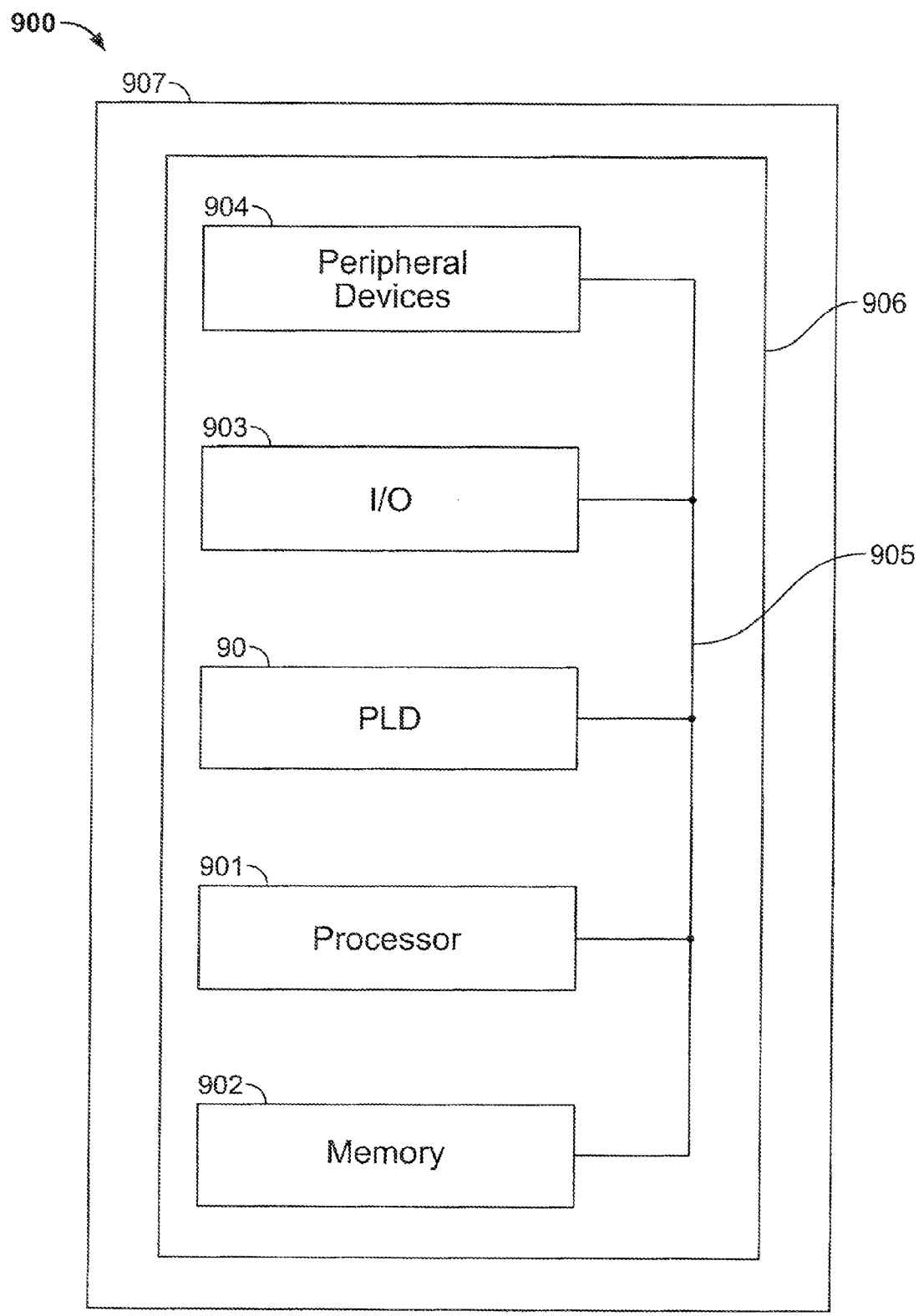
FIG. 11 is a simplified block diagram of an illustrative system employing a programmable logic device incorporating the present invention.

A PLD 90 programmed according to the present invention may be used in many kinds of electronic devices. One possible use is in a data processing system 900 shown in FIG. 11. Data processing system 900 may include one or more of the following components: a processor 901; memory 902; I/O circuitry 903; and peripheral devices 904. These components are coupled together by a system bus 905 and are populated on a circuit board 906 which is contained in an end-user system 907.

System 900 can be used in a wide variety of applications, such as computer networking, data networking, instrumentation, video processing, digital signal processing, or any other application where the advantage of using programmable or reprogrammable logic is desirable. PLD 90 can be used to perform a variety of different logic functions. For example, PLD 90 can be configured as a processor or controller that works in cooperation with processor 901. PLD 90 may also be used as an arbiter for arbitrating access to a shared resources in system 900. In yet another example, PLD 90 can be configured as an interface between processor 901 and one of the other components in system 900. It should be noted that system 900 is only exemplary, and that the true scope and spirit of the invention should be indicated by the following claims.

Various technologies can be used to implement PLDs 90 as described above and incorporating this invention.

It will be understood that the foregoing is only illustrative of the principles of the invention, and that various modifications can be made by those skilled in the art without departing from the scope and spirit of the invention. For example, the various elements of this invention can be provided on a PLD in any desired number and/or arrangement. One skilled in the art will appreciate that the present invention can be practiced by other than the described embodiments, which are presented for purposes of illustration and not of limitation, and the present invention is limited only by the claims that follow.

What is claimed is:

1. Circuitry for, in p parallel streams, searching a received codeword having n received symbols for roots of a cyclic code polynomial having a number of terms, where n and p are positive integers greater than 1 that have differing values that are not integer multiples of one another, said circuitry comprising:
   a plurality of multipliers;
   a source of constants derived from roots of said polynomial, said source of constants comprising a respective register corresponding to each respective term of said polynomial; and
   at least one counter that supplies an index; wherein for a symbol of said received codeword:
   said multipliers multiply respective terms of said polynomial for a previous received symbol by constants from said source of constants; and
   said counter advances to select respective products of said constants and said respective terms for said previous received symbol by providing an index into each said respective register to select a constant from said source of constants for multiplication by said respective term of said polynomial.

2. The circuitry of claim 1 wherein said counter is modulo-p and counts up by 1 from a start position between 0 and p-1.

3. The circuitry of claim 1 wherein said counter is modulo-p and counts down by 1 from a start position between p-1 and 0.

4. The circuitry of claim 1 wherein said counter is modulo-n and counts up by p from a start position between 0 and n-1.

5. The circuitry of claim 1 wherein said counter is modulo-n and counts down by p from a start position between n-1 and 0.

6. The circuitry of claim 1 wherein for each of said p parallel streams:
   said plurality of multipliers is equal in number to said number of terms in said polynomial;
   each said respective register stores p constants; and
   said at least one counter comprises a single counter.

7. The circuitry of claim 1 wherein:
   said at least one counter comprises a single counter; and
   for each of said p parallel streams:
   said plurality of multipliers is equal in number to said number of terms in said polynomial;
   said source of constants comprises a respective register corresponding to each respective term of said polynomial,
   a respective index location in each said respective register is determined by using output of said single counter as an index into a table of start positions, and
   said respective index location selects a constant for multiplication by said respective term of said polynomial.

8. Circuitry for, in p parallel streams, searching a received codeword having n received symbols for roots of a cyclic code polynomial having a number of terms, where n and p are positive integers greater than 1 that have differing values that are not integer multiples of one another, said circuitry comprising:
   a plurality of multipliers equal in number to a product of said number of terms in said polynomial and a term number at most equal to p;
   a source of constants derived from roots of said polynomial; and
   at least one counter that supplies an index; wherein:
   for a received symbol of said received codeword, said multipliers multiply respective terms of said polynomial for a previous received symbol by constants from said source of constants, each of said plurality of multipliers multiplying one term of said polynomial by one of said constants, such that for each of said polynomial terms, there are a term number of products;
   said circuitry further comprises, for each of said p parallel streams, a respective selector for each term of said polynomial; and
   said at least one counter controls said respective selectors to select one of said term number of products by selecting respective products of said constants and said respective terms for said previous received symbol.

9. The circuitry of claim 8 wherein:
   said at least one counter comprises one said counter for each stream of said p parallel streams.

10. The circuitry of claim 8 wherein:
    said at least one counter comprises a single counter; and
    said term number of products are presented to said respective selectors in a different order in each of said p parallel streams.

11. The circuitry of claim 8 wherein each said selector is a multiplexer.

12. A method of configuring a programmable device as circuitry for, in p parallel streams, searching a received codeword having n received symbols for roots of a cyclic code polynomial having a number of terms, where n and p are positive integers greater than 1 that have differing values that are not integer multiples of one another, said method comprising:
    configuring said programmable device with a plurality of multipliers;
    configuring, in said programmable device, a source of constants derived from roots of said polynomial, said source of constants comprising a respective register corresponding to each respective term of said polynomial; and
    configuring logic of said programmable device as at least one counter that supplies an index; wherein for a received symbol of said received codeword:
    said multipliers multiply respective terms of said polynomial for a previous received symbol by constants from said source of constants; and
    said counter advances to select respective products of said constants and said respective terms for said previous received symbol by providing an index into each said respective register to select a constant from said source of constants for multiplication by said respective term of said polynomial.

13. The method of claim 12 wherein said configuring logic of said programmable device as at least one counter comprises configuring said at least one counter as a counter that is modulo-p and counts up by 1 from a start position between 0 and p-1.

14. The method of claim 12 wherein said configuring logic of said programmable device as at least one counter comprises configuring said at least one counter as a counter that is modulo-p and counts down by 1 from a start position between p-1 and 0.

15. The method of claim 12 wherein said configuring logic of said programmable device as at least one counter comprises configuring said at least one counter as a counter that is modulo-n and counts up by p from a start position between 0 and n-1.

16. The method of claim 12 wherein said configuring logic of said programmable device as at least one counter comprises configuring said at least one counter as a counter that is modulo-n and counts down by p from a start position between n-1 and 0.

17. The method of claim 12 wherein:
said configuring said programmable device with a plurality of multipliers comprises configuring, for each of said p parallel streams, a plurality of multipliers equal in number to said number of terms in said polynomial;
said configuring a source of constants comprises configuring each said respective register to store p constants from said source of constants; and
said configuring logic of said programmable device as at least one counter comprises configuring a single counter for each of said p parallel streams.

18. The method of claim 12 wherein:
said configuring logic of said programmable device as at least one counter comprises configuring a single counter;
said configuring said programmable device with said plurality of multipliers comprises configuring, for each of said p parallel streams, said plurality of multipliers to be equal in number to said number of terms in said polynomial;
said configuring a source of constants comprises configuring for each of said p parallel streams a respective register corresponding to each respective term of said polynomial, each said respective register being configured to store p constants; and
said configuring logic of said programmable device as at least one counter comprises configuring said single counter to provide an index into a table of start positions to determine a respective index location, said respective index location selecting a constant for multiplication by said respective term of said polynomial.

19. A method of configuring a programmable device as circuitry for, in p parallel streams, searching a received codeword having n received symbols for roots of a cyclic code polynomial having a number of terms, where n and p are positive integers greater than 1 that have differing values that are not integer multiples of one another, said method comprising:
configuring said programmable device with a plurality of multipliers comprises configuring said plurality of multipliers to be equal in number to a product of said number of terms in said polynomial and a term number at most equal to p;
configuring, in said programmable device, a source of constants derived from roots of said polynomial; and
configuring logic of said programmable device as at least one counter that supplies an index; wherein:
for a received symbol of said received codeword, each of said plurality of multipliers is configured to multiply one term of said polynomial by one of said constants, such that for each of said polynomial terms, there are a term number of products; said method further comprising:
for each of said p parallel streams, configuring logic of said programmable device as a respective selector for each term of said polynomial; wherein:
said configuring logic of said programmable device as at least one counter comprises configuring said at least one counter to control said respective selectors to select one of said term number of products by selecting respective products of said constants and respective terms for said previous received symbol.

20. The method of claim 19 wherein:
said configuring logic of said programmable device as at least one counter comprises configuring one said counter for each stream of said p parallel streams.

21. The method of claim 19 wherein:
said configuring logic of said programmable device as at least one counter comprises configuring a single counter; said method further comprising:
configuring logic of said programmable device to present said term number of products to said respective selectors in a different order in each of said p parallel streams.

22. The method of claim 19 wherein configuring logic of said programmable device as a respective selector comprises configuring logic of said programmable device as a respective multiplexer.

23. A non-transitory machine-readable data storage medium encoded with non-transitory machine-executable instructions for configuring a programmable device as circuitry for, in p parallel streams, searching a received codeword having n received symbols for roots of a cyclic code polynomial having a number of terms, where n and p are positive integers greater than 1 that have differing values that are not integer multiples of one another, said instructions comprising:
instructions to configure said programmable device with a plurality of multipliers;
instructions to configure, in said programmable device, a source of constants derived from roots of said polynomial, said source of constants comprising a respective register corresponding to each respective term of said polynomial; and
instructions to configure logic of said programmable device as at least one counter that supplies an index; wherein for a received symbol of said received codeword:
said multipliers multiply respective terms of said polynomial for a previous received symbol by constants from said source of constants; and
said counter advances to select respective products of said constants and said respective terms for said previous received symbol by providing an index into each said respective register to select a constant from said source of constants for multiplication by said respective term of said polynomial.

24. The data storage medium of claim 23 wherein said instructions to configure logic of said programmable device as at least one counter comprise instructions to configure said at least one counter as a counter that is modulo-p and counts up by 1 from a start position between 0 and p-1.

25. The data storage medium of claim 23 wherein said instructions to configure logic of said programmable device as at least one counter comprise instructions to configure said at least one counter as a counter that is modulo-p and counts down by 1 from a start position between p-1 and 0.

26. The data storage medium of claim 23 wherein said instructions to configure logic of said programmable device as at least one counter comprise instructions to configure said at least one counter as a counter that is modulo-n and counts up by p from a start position between 0 and n-1.

27. The data storage medium of claim 23 wherein said instructions to configure logic of said programmable device as at least one counter comprise instructions to configure said at least one counter as a counter that is modulo-n and counts down by p from a start position between n-1 and 0.

28. The data storage medium of claim 23 wherein:
said instructions to configure said programmable device with a plurality of multipliers comprise instructions to configure, for each of said p parallel streams, a plurality of multipliers equal in number to said number of terms in said polynomial;

said instructions to configure a source of constants comprise instructions to configure each said respective register to store p constants from said source of constants; and said instructions to configure logic of said programmable device as at least one counter comprise instructions to configure a single counter for each of said p parallel streams.

29. The data storage medium of claim 23 wherein:

said instructions to configure logic of said programmable device as at least one counter comprise instructions to configure a single counter;

said instructions to configure said programmable device with said plurality of multipliers comprise instructions to configure, for each of said p parallel streams, said plurality of multipliers to be equal in number to said number of terms in said polynomial;

said instructions to configure a source of constants comprise instructions to configure, for each of said p parallel streams, a respective register corresponding to each respective term of said polynomial, each said respective register being configured to store p constants; and said instructions to configure logic of said programmable device as at least one counter comprise instructions to configure said single counter to provide an index into a table of start positions to determine a respective index location, said respective index location selecting a constant for multiplication by said respective term of said polynomial.

30. A non-transitory machine-readable data storage medium encoded with non-transitory machine-executable instructions for configuring a programmable device as circuitry for, in p parallel streams, searching a received codeword having n received symbols for roots of a cyclic code polynomial having a number of terms, where n and p are positive integers greater than 1 that have differing values that are not integer multiples of one another, said instructions comprising:

instructions to configure said programmable device with a plurality of multipliers equal in number to a product of said number of terms in said polynomial and a term number at most equal to p;

instructions to configure, in said programmable device, a source of constants derived from roots of said polynomial;

instructions to configure logic of said programmable device as at least one counter that supplies an index; wherein for a received symbol of said received codeword, each of said plurality of multipliers is configured to multiply one term of said polynomial by one of said constants, such that for each of said polynomial terms, there are a term number of products; said instructions further comprising:

instructions to configure, for each of said p parallel streams, logic of said programmable device as a respective selector for each term of said polynomial; wherein:

said instructions to configure logic of said programmable device as at least one counter comprise instructions to configure said at least one counter to control said respective selectors to select one of said term number of products by selecting respective products of said constants and said respective terms for a previous received symbol.

31. The data storage medium of claim 30 wherein:

said instructions to configure logic of said programmable device as at least one counter comprise instructions to configure one said counter for each stream of said p parallel streams.

32. The data storage medium of claim 30 wherein:

said instructions to configure logic of said programmable device as at least one counter comprise instructions to configure a single counter; said instructions further comprising:

instructions to configure logic of said programmable device to present said term number of products to said respective selectors in a different order in each of said p parallel streams.

33. The data storage medium of claim 30 wherein said instructions to configure logic of said programmable device as a respective selector comprise instructions to configure logic of said programmable device as a respective multiplexer.

* * * * *